United States Patent
Yasuda

(10) Patent No.: US 10,148,247 B2
(45) Date of Patent: Dec. 4, 2018

(54) ELASTIC WAVE DEVICE

(71) Applicant: Murata Manufacturing Co., Ltd., Nagaokakyo-shi, Kyoto-fu (JP)

(72) Inventor: Junpei Yasuda, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 432 days.

(21) Appl. No.: 15/160,184

(22) Filed: May 20, 2016

(65) Prior Publication Data
US 2016/0380617 A1    Dec. 29, 2016

(30) Foreign Application Priority Data

Jun. 24, 2015  (JP) ................. 2015-126490

(51) Int. Cl.
H03H 9/205 (2006.01)
H03H 9/05 (2006.01)
H03H 9/02 (2006.01)

(52) U.S. Cl.
CPC ......... H03H 9/058 (2013.01); *H03H 9/02992* (2013.01)

(58) Field of Classification Search
CPC ..................................... H03H 9/058
USPC ..................................... 310/313 B
See application file for complete search history.

(56) References Cited

U.S. PATENT DOCUMENTS

| 6,882,249 | B2 * | 4/2005 | Takamine | H03H 9/0042 310/313 B |
|---|---|---|---|---|
| 8,723,624 | B2 * | 5/2014 | Kurahashi | H03H 9/0222 310/313 B |
| 9,065,420 | B2 * | 6/2015 | Kurihara | H03H 3/08 |
| 2011/0140808 | A1 | 6/2011 | Kurahashi et al. | |
| 2013/0335171 | A1 | 12/2013 | Yamato et al. | |
| 2014/0003017 | A1 | 1/2014 | Kai et al. | |

(Continued)

FOREIGN PATENT DOCUMENTS

JP   2001-257555 A   9/2001
JP   2015-002511 A   1/2015

(Continued)

OTHER PUBLICATIONS

Official Communication issued in corresponding Japanese Patent Application No. 2015-126490, dated Nov. 7, 2017.

*Primary Examiner* — Thomas Dougherty
(74) *Attorney, Agent, or Firm* — Keating & Bennett, LLP

(57) ABSTRACT

An elastic wave device includes a piezoelectric substrate, first and second IDT electrodes disposed on a first main surface, and bumps each connected to one of the first and second IDT electrodes. First and second side portions extend in a direction perpendicular or substantially perpendicular to the polarization axis direction and to a direction normal to the piezoelectric substrate. The length of the piezoelectric substrate along the polarization axis direction at the first side portion is shorter than that at the second side portion. The first IDT electrode is located at a position closer to the first side portion than the second IDT electrode. The bumps include three or more first side bumps including first and second bumps that sandwich the first IDT electrode therebetween. The distance between the first and second bumps is the smallest distance among the distances between adjacent bumps of the first side bumps.

20 Claims, 5 Drawing Sheets

(56) References Cited

U.S. PATENT DOCUMENTS

| | | |
|---|---|---|
| 2014/0368296 A1 | 12/2014 | Nishizawa |
| 2016/0149554 A1 | 5/2016 | Nakagawa |
| 2016/0156334 A1 | 6/2016 | Nakagawa |
| 2016/0277003 A1* | 9/2016 | Kikuchi .................. H03H 3/08 |
| 2016/0294361 A1* | 10/2016 | Yamane ............. H03H 9/02574 |
| 2016/0380613 A1* | 12/2016 | Yasuda ............. H03H 9/02543 |
| | | 310/313 B |

FOREIGN PATENT DOCUMENTS

| | | |
|---|---|---|
| WO | 2010/029657 A1 | 3/2010 |
| WO | 2012/120968 A1 | 9/2012 |
| WO | 2012/132147 A1 | 10/2012 |
| WO | 2015/033891 A1 | 3/2015 |
| WO | 2015/033892 A1 | 3/2015 |

* cited by examiner

ELASTIC WAVE DEVICE

BACKGROUND OF THE INVENTION

1. Field of the Invention

The present invention relates to an elastic wave device.

2. Description of the Related Art

Elastic wave devices are widely used, for example, in cellular phones. For example, Japanese Unexamined Patent Application Publication No. 2015-002511 discloses an elastic wave device having interdigital transducer (IDT) electrodes. Plural pads are disposed alongside portions of one main surface of a piezoelectric substrate of the elastic wave device.

In the piezoelectric substrate of the elastic wave device disclosed in Japanese Unexamined Patent Application Publication No. 2015-002511, polarization reversal easily occurs by the generation of electric charge due to the piezoelectric effect or the pyroelectric effect. Due to the occurrence of polarization reversal, the piezoelectricity may be decreased, which may also increase the insertion loss of the elastic wave device.

SUMMARY OF THE INVENTION

Accordingly, preferred embodiments of the present invention provide an elastic wave device in which polarization reversal is less likely to occur in a piezoelectric substrate so as to suppress or prevent an increase in the insertion loss.

According to a broad aspect of various preferred embodiments of the present invention, an elastic wave device including a piezoelectric substrate, first and second interdigital transducer electrodes, and a plurality of bumps. The piezoelectric substrate includes first and second main surfaces which oppose each other and first and second side portions which oppose each other on the first main surface. A direction of a polarization axis of the piezoelectric substrate is inclined with respect to a direction normal to the first main surface. The first and second interdigital transducer electrodes are disposed on the first main surface of the piezoelectric substrate and each include first and second busbars which oppose each other, a plurality of first electrode fingers, and a plurality of second electrode fingers. One end of each of the plurality of first electrode fingers is connected to the first busbar. One end of each of the plurality of second electrode fingers is connected to the second busbar. The plurality of bumps are disposed on the first main surface of the piezoelectric substrate and are each electrically connected to a corresponding one of the first and second interdigital transducer electrodes. The first and second side portions of the piezoelectric substrate extend in a direction perpendicular or substantially perpendicular to the direction of the polarization axis and to the direction normal to the first main surface. A length of the piezoelectric substrate along the direction of the polarization axis at the first side portion is shorter than a length of the piezoelectric substrate along the direction of the polarization axis at the second side portion. The first interdigital transducer electrode is located at a position closer to the first side portion than the second interdigital transducer electrode in an extending direction of the plurality of first and second electrode fingers of the first interdigital transducer electrode. The plurality of bumps include three or more first side bumps disposed along the first side portion, the three or more first side bumps including first, second, and third bumps. The first and second bumps sandwich the first interdigital transducer electrode therebetween in a direction parallel or substantially parallel with the first side portion. A distance between the first and second bumps is the smallest distance among distances between adjacent bumps of the first side bumps.

According to another broad aspect of various preferred embodiments of the present invention, an elastic wave device includes a piezoelectric substrate, first and second interdigital transducer electrodes, and a plurality of bumps. The piezoelectric substrate includes first and second main surfaces which oppose each other and which have a rectangular or substantially rectangular shape, first and second side portions which oppose each other on the first main surface, and third and fourth side portions which connect the first and second side portions with each other. A direction of a polarization axis of the piezoelectric substrate is inclined with respect to a direction normal to the first main surface. The first and second interdigital transducer electrodes are disposed on the first main surface of the piezoelectric substrate and each include first and second busbars which oppose each other, a plurality of first electrode fingers, and a plurality of second electrode fingers. One end of each of the plurality of first electrode fingers is connected to the first busbar. One end of each of the plurality of second electrode fingers is connected to the second busbar. The plurality of bumps are disposed on the first main surface of the piezoelectric substrate and are each electrically connected to a corresponding one of the first and second interdigital transducer electrodes. The first and second side portions of the piezoelectric substrate extend along the first main surface of the piezoelectric substrate and in a direction perpendicular or substantially perpendicular to the direction of the polarization axis. A length of the piezoelectric substrate along the direction of the polarization axis at the first side portion is shorter than a length of the piezoelectric substrate along the direction of the polarization axis at the second side portion. The first interdigital transducer electrode is located at a position closer to the first side portion than the second interdigital transducer electrode in an extending direction of the plurality of first and second electrode fingers of the first interdigital transducer electrode. The plurality of bumps include three or more first side bumps disposed along the first side portion, the three or more first side bumps including first, second, and third bumps. The first and second bumps sandwich the first interdigital transducer electrode therebetween in a direction parallel or substantially parallel with the first side portion. A distance between the first and second bumps is smaller than distances between adjacent bumps of the other first side bumps.

According to a specific aspect of various preferred embodiments of the present invention, the plurality of bumps may include a plurality of second side bumps disposed along the second side portion of the piezoelectric substrate, the plurality of second side bumps including a plurality of fourth bumps. The distance between the first and second bumps may be smaller than distances between adjacent bumps of the plurality of second side bumps. With this configuration, it is even less likely that the piezoelectric substrate will be deformed, which makes it possible to effectively suppress or prevent the generation of electric charge caused by the piezoelectric effect. Accordingly, polarization reversal is less likely to occur, thus making it possible to further suppress or prevent an increase in the insertion loss.

According to another specific aspect of various preferred embodiments of the present invention, the distance between the first and second bumps may be the smallest distance among distances between adjacent bumps of all the plurality of bumps. With this configuration, it is even less likely that the piezoelectric substrate will be deformed, which makes it possible to effectively suppress or prevent the generation of electric charge caused by the piezoelectric effect.

According to another specific aspect of various preferred embodiments of the present invention, at least one of the first and second bumps may be electrically connected to the first interdigital transducer electrode. With this configuration, electric charge generated due to the piezoelectric effect is easily transferred to the outside. Accordingly, polarization reversal is less likely to occur, thereby making it possible to further suppress or prevent an increase in the insertion loss.

According to another specific aspect of various preferred embodiments of the present invention, the first and second bumps may be electrically connected to the first interdigital transducer electrode. With this configuration, electric charge generated due to the piezoelectric effect is more easily transferred to the outside.

According to another specific aspect of various preferred embodiments of the present invention, the elastic wave device may further include a connecting line that connects the first interdigital transducer electrode and at least one of the plurality of bumps with each other. The connecting line may be located at a position closer to the first side portion of the piezoelectric substrate than the first interdigital transducer electrode. With this configuration, electric charge generated near the first side portion is even less likely to reach the portion where the first and second electrode fingers of the first interdigital transducer electrode are disposed. It is thus possible to further suppress or prevent an increase in the insertion loss.

According to various preferred embodiments of the present invention, it is possible to provide an elastic wave device in which polarization reversal is less likely to occur in a piezoelectric substrate so as to suppress or prevent an increase in the insertion loss.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will be described below in detail through illustration of exemplary preferred embodiments with reference to the accompanying drawings.

The preferred embodiments described below are only examples. Note that, among the different preferred embodiments, portions, features or elements of one preferred embodiment may be replaced by or combined with that of another preferred embodiment.

Figure 1:
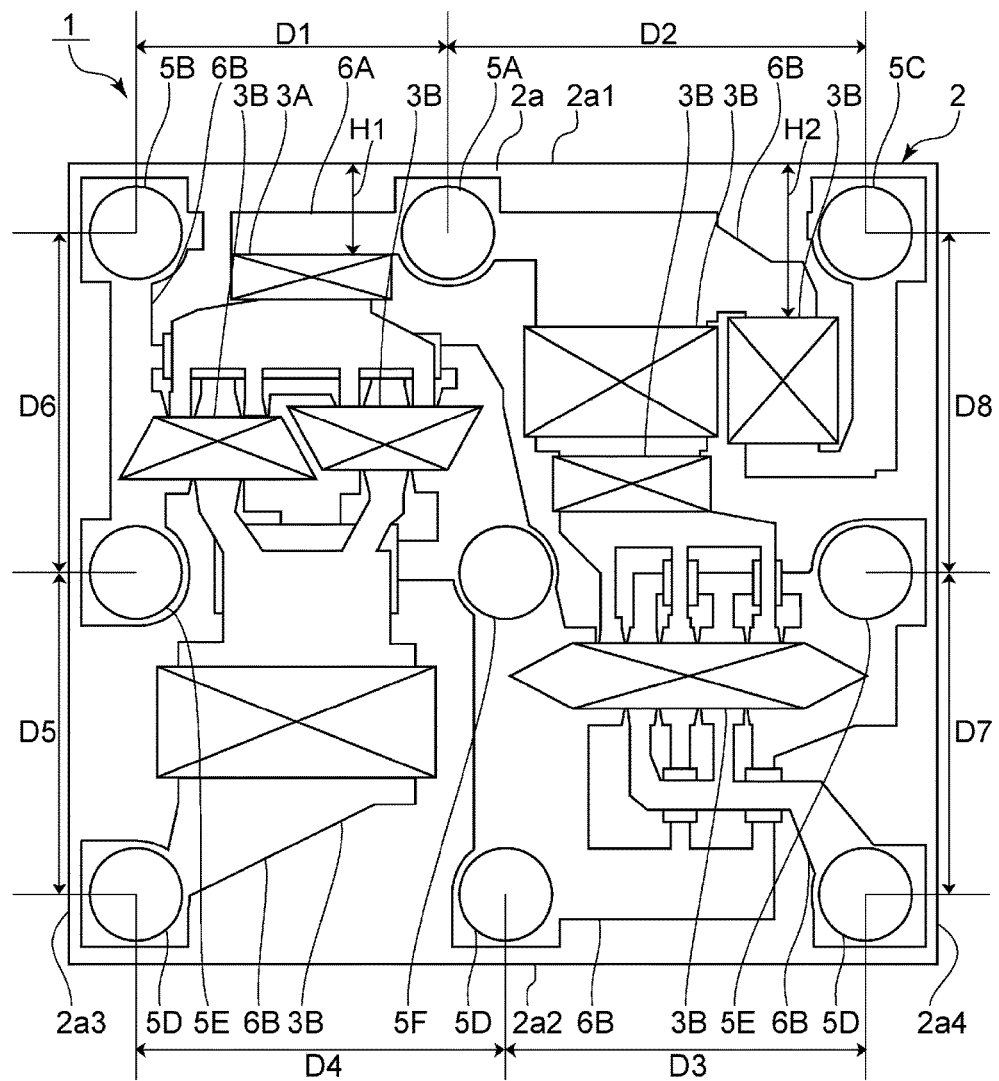
FIG. 1 is a schematic plan view of an elastic wave device according to a first preferred embodiment of the present invention.

FIG. 1 is a schematic plan view of an elastic wave device 1 according to a first preferred embodiment of the present invention.

The elastic wave device 1 includes a piezoelectric substrate 2. The piezoelectric substrate 2 includes a first main surface 2a and a second main surface 2b (shown in FIG. 2) opposing each other. The first and second main surfaces 2a and 2b preferably have a rectangular or substantially rectangular shape. The first main surface 2a includes first and second side portions 2a1 and 2a2 opposing each other and also includes third and fourth side portions 2a3 and 2a4 which connect the first and second side portions 2a1 and 2a2 with each other. The piezoelectric substrate 2 is made of a piezoelectric single crystal, such as $LiNbO_3$ and $LiTaO_3$. Alternatively, the piezoelectric substrate 2 may be made of piezoelectric ceramics.

Figure 2:
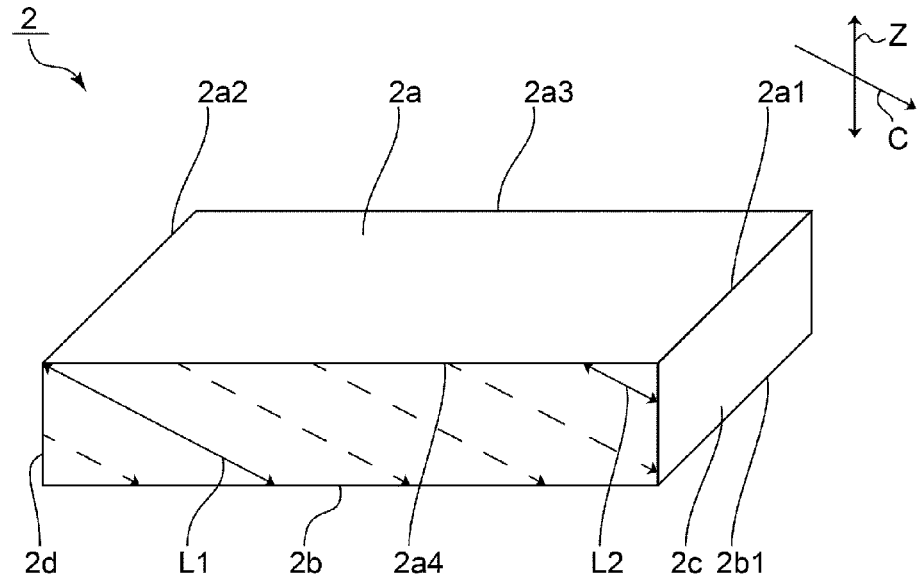
FIG. 2 is a perspective view of a piezoelectric substrate in the first preferred embodiment of the present invention.

FIG. 2 is a perspective view of the piezoelectric substrate 2. The piezoelectric substrate 2 has a thickness along a direction Z (hereinafter referred to as the "thickness direction Z"), which is parallel or substantially parallel with a direction normal to the first main surface 2a. The piezoelectric substrate 2 has a polarization axis along a direction C (hereinafter referred to as the "polarization axis direction C"), which is inclined with respect to the direction normal to the first main surface 2a. The first and second side portions 2a1 and 2a2 of the piezoelectric substrate 2 extend in a direction perpendicular or substantially perpendicular to the thickness direction Z and the polarization axis direction C. The length of the piezoelectric substrate 2 along the thickness direction Z is uniform at any position of the first main surface 2a. In contrast, the length of the piezoelectric substrate 2 along the polarization axis direction C varies depending on the position of the first main surface 2a. More specifically, the length of the piezoelectric substrate 2 along the polarization axis direction C is indicated by L, and in this case, the length L at the first side portion 2a1 is shorter than the length L at the second side portion 2a2. This will be discussed in detail later.

Referring back to FIG. 1, on the first main surface 2a of the piezoelectric substrate 2, a first IDT electrode 3A and plural second IDT electrodes 3B are disposed. In the first preferred embodiment, all the IDT electrodes, except for the first IDT electrode 3A, disposed on the first main surface 2a are the plural second IDT electrodes 3B. The first IDT electrode 3A will be described below in detail with reference to FIG. 3.

Figure 3:
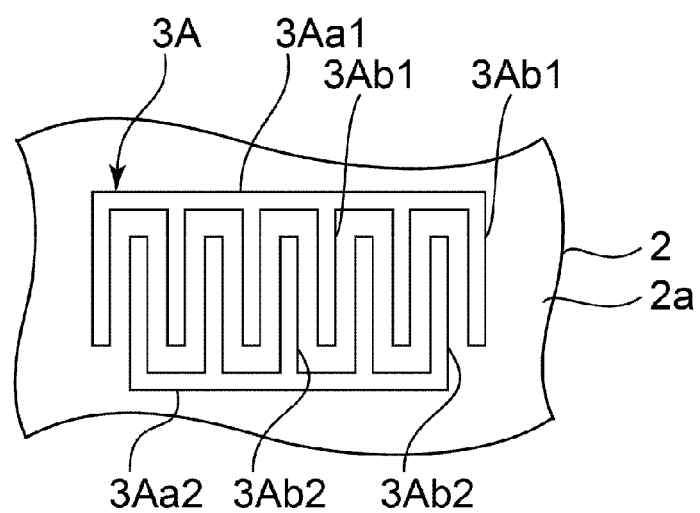
FIG. 3 is a cutaway plan view partially illustrating the electrode structure of a first IDT electrode in the first preferred embodiment of the present invention.

FIG. 3 is a cutaway plan view partially illustrating the electrode structure of the first IDT electrode 3A in the first preferred embodiment. In FIG. 3, lines connected to the first IDT electrode 3A are not shown.

In FIG. 1, the first IDT electrode 3A is schematically represented in the shape of a rectangle with diagonal lines. As shown in FIG. 3, however, the first IDT electrode 3A includes first and second busbars 3Aa1 and 3Aa2 opposing each other, and also includes plural first and second electrode fingers 3Ab1 and 3Ab2. One end of each of the plural first electrode fingers 3Ab1 is connected to the first busbar 3Aa1. One end of each of the plural second electrode fingers 3Ab2 is connected to the second busbar 3Aa2. The plural first electrode fingers 3Ab1 and the plural second electrode fingers 3Ab2 are fit into each other in an interdigitated arrangement. The first busbar 3Aa1 is disposed between the plural first and second electrode fingers 3A*b*1 and 3A*b*2 and the first side portion 2*a*1 of the piezoelectric substrate 2 shown in FIG. 1.

By applying a voltage to the first IDT electrode 3A, elastic waves are excited. A reflector may be disposed on each side of the first IDT electrode 3A in the propagating direction of elastic waves. In this manner, a one-port elastic wave resonator is provided. The first side portion 2*a*1 of the piezoelectric substrate 2 extends in the propagating direction of elastic waves of the first IDT electrode 3A.

Figure 4:
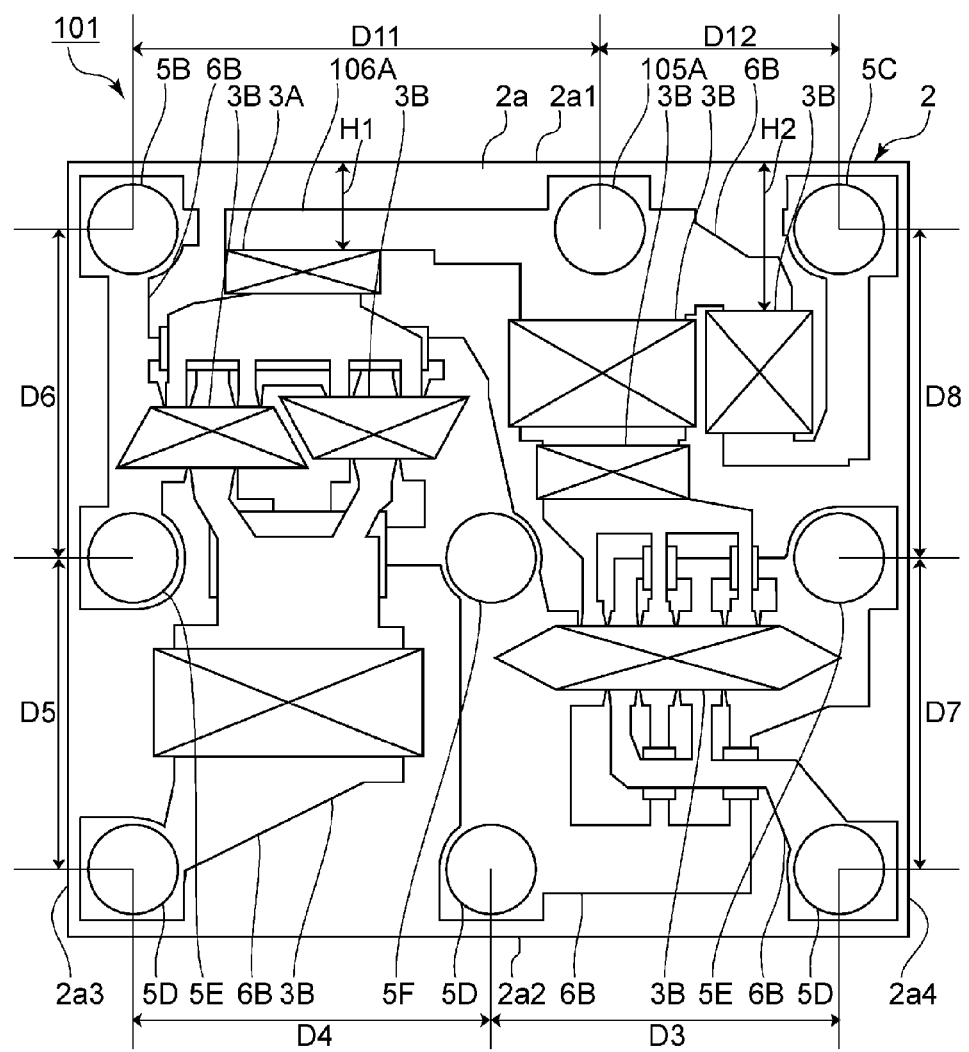
FIG. 4 is a schematic plan view of an elastic wave device of a comparative example.
Figure 5:
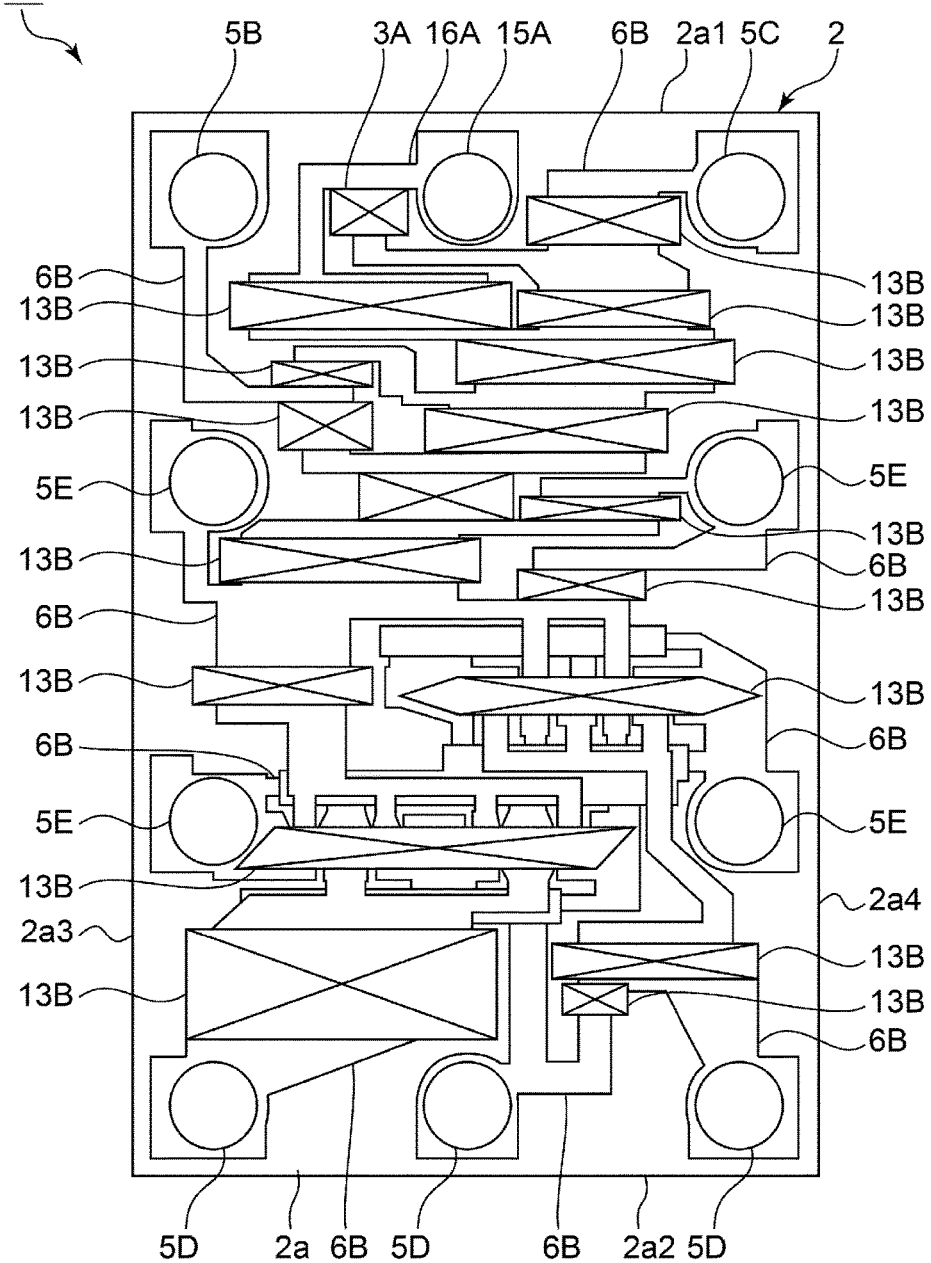
FIG. 5 is a schematic plan view of an elastic wave device according to a second preferred embodiment of the present invention.
Figure 6:
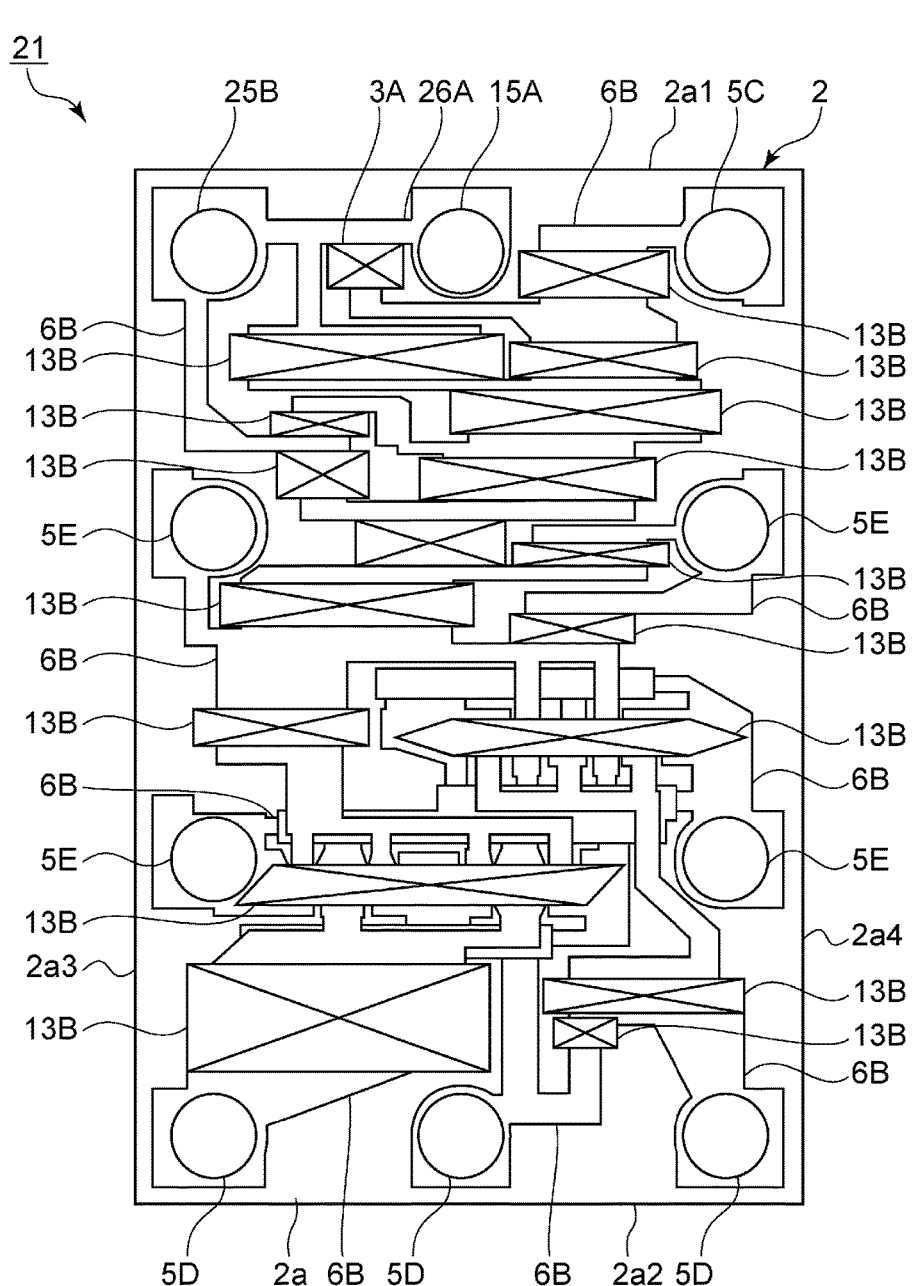
FIG. 6 is a schematic plan view of an elastic wave device according to a third preferred embodiment of the present invention.

Each of the second IDT electrodes 3B, as well as the first IDT electrode 3A, includes first and second busbars opposing each other and plural first and second electrode fingers. One end of each of the plural first electrode fingers is connected to the first busbar, while one end of each of the plural second electrode fingers is connected to the second busbar. In FIGS. 4 through 6, the first IDT electrode and the plural second IDT electrodes are also schematically represented in the shape of a rectangle or another polygon with diagonal lines.

Referring back to FIG. 1, the first IDT electrode 3A is located closer to the first side portion 2*a*1 of the piezoelectric substrate 2 than the plural second IDT electrodes 3B in the extending direction of the first and second electrode fingers 3A*b*1 and 3A*b*2 of the first IDT electrode 3A.

In the first preferred embodiment, elastic waves excited in the first IDT electrode 3A and those excited in the second IDT electrodes 3B propagate in parallel or substantially parallel with each other. In the direction perpendicular or substantially perpendicular to the propagating direction of elastic waves on the first main surface 2*a* of the piezoelectric substrate 2, the shortest distance between the first and second busbars 3A*a*1 and 3A*a*2 of the first IDT electrode 3A and the edge of the piezoelectric substrate 2 is represented by a distance H1. More specifically, the distance H1 in the elastic wave device 1 is the distance between the first busbar 3A*a*1 of the first IDT electrode 3A and the first side portion 2*a*1. Similarly, the shortest distance between the first and second busbars of the second IDT electrode 3B and the edge of the piezoelectric substrate 2 is represented by a distance H2. In this case, the distance H2 is the distance between the first side portion 2*a*1 and the first busbar of the second IDT electrode 3B which is located at a position closest to the first side portion 2*a*1. It is preferable that the distance H1 be smaller than the distance H2, and more specifically, that the distance H1 be smaller than the shortest distance among distances between the edge of the piezoelectric substrate 2 and the busbars of the IDT electrodes other than the first IDT electrode 3A that are disposed along the first side portion 2*a*1.

On the first main surface 2*a* of the piezoelectric substrate 2, plural bumps are provided. More specifically, on the first main surface 2*a*, plural electrode lands are provided, and bumps are provided on the respective electrode lands. One of the first and second IDT electrodes 3A and 3B is electrically connected to each of the electrode lands and the associated bump. The elastic wave device 1 is electrically connected to an external source by using these bumps.

The plural bumps include plural first side bumps disposed along the first side portion 2*a*1 of the piezoelectric substrate 2. In the first preferred embodiment, the plural first side bumps include first, second, and third bumps 5A, 5B, and 5C. The first and second bumps 5A and 5B sandwich the first IDT electrode 3A therebetween in the direction parallel or substantially parallel with the first side portion 2*a*1.

The plural bumps also include plural second side bumps disposed along the second side portion 2*a*2 of the piezoelectric substrate 2. The plural second side bumps include plural fourth bumps 5D. The plural bumps also include bumps other than the first through fourth bumps 5A through 5D, that is, plural fifth bumps 5E and a sixth bump 5F. As discussed above, the piezoelectric substrate 2 preferably has a rectangular or substantially rectangular shape in which the third and fourth side portions 2*a*3 and 2*a*4 connect the first and second side portions 2*a*1 and 2*a*2 with each other. The plural fifth bumps 5E are located along the third and fourth side portions 2*a*3 and 2*a*4. The sixth bump 5F is located at the inner portion of the first main surface 2*a* and is not located along any of the side portions 2*a*1 through 2*a*4. The number and the positional arrangement of the bumps other than the first and second bumps 5A and 5B are not particularly restricted.

The first bump 5A is connected to the first busbar 3A*a*1 of the first IDT electrode 3A without having the second IDT electrode 3B interposed therebetween. The first bump 5A may be connected to the second busbar 3A*a*2 of the first IDT electrode 3A which is located farther apart from the first side portion 2*a*1 than the first busbar 3A*a*1. Alternatively, the first bump 5A may not necessarily be connected to the first IDT electrode 3A.

On the first main surface 2*a* of the piezoelectric substrate 2, plural connecting lines 6A and 6B are disposed. Each of the connecting lines 6A and 6B connects one of the first and second IDT electrodes 3A and 3B to the associated electrode land and bump. The first and second IDT electrodes 3A and 3B define a portion of a ladder filter circuit including a trap filter.

Some of the unique characteristics of the first preferred embodiment include:

(1) that the length L of the piezoelectric substrate 2 along the polarization axis direction C at the first side portion 2*a*1 is short, and that the first IDT electrode 3A is located at a position near the first side portion 2*a*1; and (2) that the distance D1 between the first and second bumps 5A and 5B disposed to sandwich the first IDT electrode 3A therebetween is the smallest distance among the distances D1 and D2 between adjacent bumps of the first through third bumps 5A through 5C, and that the distance D1 between the first and second bumps 5A and 5B is the smallest distance among the distances D1 through D8 between adjacent bumps of the first through fifth bumps 5A through 5E. With this configuration, polarization reversal is less likely to occur in the piezoelectric substrate 2, which makes it possible to suppress or prevent an increase in the insertion loss. This will be explained below more specifically by using a comparative example.

FIG. 4 is a schematic plan view of an elastic wave device 101 of a comparative example.

In the elastic wave device 101, the first busbar of the first IDT electrode 3A is connected to a first bump 105A via a connecting line 106A. As in the first preferred embodiment, the distance between the first busbar of the first IDT electrode 3A and the edge of the first main surface 2*a* of the piezoelectric substrate 2 is the shortest distance H1. The distance D11 between the first bump 105A and the second bump 5B shown in FIG. 4 is greater than the distance D12 between the first bump 105A and the third bump 5C. Apart from these points, the configuration of the elastic wave device 101 is similar to that of the elastic wave device 1 of the first preferred embodiment of the present invention.

As the electric field, stress, and heat acting on a piezoelectric body is greater, polarization reversal is likely to occur. This will be explained more specifically. Electric charge is generated in the piezoelectric substrate due to the piezoelectric effect or the pyroelectric effect. In this case, due to the generation of electric charge, an electric field may be applied to the piezoelectric substrate in the direction opposite to the polarization axis direction. When the intensity of this electric field exceeds the coercive electric field at a portion to which the electric field is applied, polarization reversal occurs.

The coercive electric field in the piezoelectric substrate becomes smaller as the length L of the piezoelectric substrate along the polarization axis direction C is shorter. The portion of the piezoelectric substrate having the shortest length L in the first preferred embodiment and the comparative example will be discussed below with reference to FIG. 2. As described above, the configuration of the piezoelectric substrate 2 of the comparative example is similar to that of the first preferred embodiment of the present invention.

As shown in FIG. 2, the piezoelectric substrate 2 includes first and second side surfaces 2c and 2d respectively extending from the first and second side portions 2a1 and 2a2 in the thickness direction Z. The second main surface 2b of the piezoelectric substrate 2 includes a fifth side portion 2b1 which opposes the first side portion 2a1 in the thickness direction Z.

In FIG. 2, the polarization axis of the piezoelectric substrate 2 is indicated by the dashed arrows. In the first preferred embodiment, the base end of the polarization axis is positioned near the first main surface 2a and the terminating end thereof is positioned near the second main surface 2b. The polarization axis direction C is not particularly restricted as long as it tilts with respect to the direction normal to the first main surface 2a.

In the piezoelectric substrate 2, the above-described length L is the longest at a portion in which the base end of the polarization axis is located on the first main surface 2a and the terminating end thereof is located on the second main surface 2b. Accordingly, the length L at the second side portion 2a2 is the longest length. Here, the length L at the second side portion 2a2 is set to be the length L1.

In contrast, in the piezoelectric substrate 2, at a portion in which the base end of the polarization axis is located on the first main surface 2a and the terminating end thereof is located on the first side surface 2c, the length L becomes shorter as the terminating end of the polarization axis approaches the first side portion 2a1 from the fifth side portion 2b1. The length L at a portion in which the terminating end of the polarization axis is located at the first side surface 2c and at a position other than the fifth side portion 2b1 is represented by the length L2. In this case, the length L2 is shorter than the length L1. The length L2 becomes shorter as the terminating end of the polarization axis approaches the first side portion 2a1. If the piezoelectric substrate 2 has an ideal rectangular parallelepiped shape, the length L at the first side portion 2a1 becomes 0. In the vicinity of the first side portion 2a1, the length L2 is almost 0. Although the length L at the first side portion 2a1 is ideally 0, it may be a length which is almost 0. In a preferred embodiment of the present invention, the length of the piezoelectric substrate along the polarization axis direction at the first side portion, which is compared with the length L1, includes a length of 0. Accordingly, the length L of the piezoelectric substrate 2 is the shortest at the first side portion 2a1.

Polarization reversal is more likely to occur in a portion of a piezoelectric body at which the polarization axis is shorter than that at which the polarization axis is longer. This means that the coercive electric field is small at the first side portion 2a1 of the piezoelectric substrate 2. If thermal shock is applied to the piezoelectric substrate 2, the piezoelectric substrate 2 is deformed, and electric charge is generated due to the piezoelectric effect. In the elastic wave device 101 of the comparative example, due to the generation of electric charge, polarization reversal is likely to occur at the first side portion 2a1 in which the coercive electric field is small. The coercive electric field is also small in the vicinity of the first side portion 2a1 on the first main surface 2a, and thus, polarization reversal is also likely to occur in this portion.

In the portion of the piezoelectric substrate 2 where the first IDT electrode 3A is disposed, polarization reversal may also occur starting from the first side portion 2a1. Since the first IDT electrode 3A is located closer to the first side portion 2a1 than the second IDT electrodes 3B, the piezoelectricity at this portion may be decreased, which may also increase the insertion loss of the elastic wave device 101. In particular, the edge of the piezoelectric substrate is vulnerable to stress and heat.

In contrast, as shown in FIG. 1, in the elastic wave device 1 of the first preferred embodiment, the distance D1 between the first and second bumps 5A and 5B disposed to sandwich the first IDT electrode 3A therebetween is the smallest distance among the distances D1 through D4 between adjacent bumps of all the first through fourth bumps 5A through 5D disposed along the first side portion 2a1 and the second side portion 2a2. The distance D1 is also the smallest distance among the distances D1 through D8 between adjacent bumps of all the first through fifth bumps 5A through 5E disposed along the first through fourth side portions 2a1 through 2a4. With this configuration, even if a force is applied to the piezoelectric substrate 2, the deformation of the portion where the first IDT electrode 3A, which is located closest to the edge of the piezoelectric substrate 2, is disposed is significantly reduced or minimized, thus making it possible to suppress or prevent the generation of electric charge caused by the piezoelectric effect. Accordingly, polarization reversal is less likely to occur in the portion of the piezoelectric substrate 2 where the first IDT electrode 3A is disposed than in the configuration of the elastic wave device 101 shown in FIG. 4. As a result, the piezoelectricity is less likely to decrease, which makes it possible to suppress or prevent an increase in the insertion loss.

It is preferable that the distance between the first and second bumps 5A and 5B be the smallest distance among the distances between adjacent bumps of the bumps disposed along the first side portion 2a1. In this case, it is sufficient that the distance between the first and second bumps 5A and 5B is not greater than the distance between the second and third bumps 5B and 5C. With this arrangement, the generation of electric charge due to the piezoelectric effect is less likely to occur, which makes it possible to suppress or prevent an increase in the insertion loss.

More preferably, the distance between the first and second bumps 5A and 5B is smaller than any of the distances between adjacent bumps of the plural fourth bumps 5D disposed along the second side portion 2a2 of the piezoelectric substrate 2. At the second side portion 2a2 shown in FIG. 2, the length L of the piezoelectric substrate 2 along the polarization axis direction C is the longest length, and the coercive electric field is large. Because of this configuration, even with the generation of electric charge, polarization reversal is less likely to occur. Accordingly, at the first side portion 2a1 where the coercive electric field is small, the first and second bumps 5A and 5B are disposed such that the distance therebetween is smaller than the distances between adjacent bumps of the fourth bumps 5D, thereby making it possible to suppress or prevent an increase in the insertion loss more effectively.

More preferably, as in the first preferred embodiment, the distance D1 between the adjacent first and second bumps 5A and 5B is smaller than the distances D2 through D8 between adjacent bumps of the first through fifth bumps 5A through 5E disposed along the peripheral edges, that is, the first through fourth side portions 2a1 through 2a4, of the first main surface 2a of the piezoelectric substrate 2 preferably has a rectangular or substantially rectangular shape.

In the first preferred embodiment, the first IDT electrode 3A entirely overlaps the first and second bumps 5A and 5B, as viewed from the propagating direction of elastic waves of the first IDT electrode 3A. With this configuration, it is possible to effectively suppress or prevent the deformation of the first side portion 2a1 and the portion where the first IDT electrode 3A is disposed. Thus, the generation of electric charge due to the piezoelectric effect is less likely to occur.

The first IDT electrode 3A may partially overlap the first and second bumps 5A and 5B, as viewed from the propagating direction of elastic waves of the first IDT electrode 3A. With this configuration, too, it is less likely that the first side portion 2a1 and the portion where the first IDT electrode 3A is disposed will be deformed.

The first bump 5A is connected to the first IDT electrode 3A, so that heat dissipation is enhanced. Accordingly, it is also less likely that the generation of electric charge due to the pyroelectric effect will occur.

Additionally, the first and second bumps 5A and 5B are disposed to sandwich the first IDT electrode 3A therebetween, and are also located close to the first IDT electrode 3A. That is, the distance between the first IDT electrode 3A and the first bump 5A is also small, and the connecting line 6A which connects the first busbar 3Aa1 of the first IDT electrode 3A and the first bump 5A is also short. Accordingly, the electric resistance between the first IDT electrode 3A and the first bump 5A is low, so that electric charge generated near the portion where the first IDT electrode 3A is disposed is easily transferred to the outside via the connecting line 6A and the first bump 5A.

The first busbar 3Aa1 of the first IDT electrode 3A is interposed between the first and second electrode fingers 3Ab1 and 3Ab2 of the first IDT electrode 3A and the first side portion 2a1 of the piezoelectric substrate 2. Accordingly, electric charge generated near the first side portion 2a1 is transferred to the outside via the first busbar 3Aa1 and the connecting line 6A, which are located closer to the first side portion 2a1 than the first and second electrode fingers 3Ab1 and 3Ab2. Thus, electric charge generated near the first side portion 2a1 is less likely to reach the portion where the first and second electrode fingers 3Ab1 and 3Ab2 are disposed. Hence, it is less likely that the piezoelectricity at the portion where elastic waves of the first IDT electrode 3A are excited will be decreased, thus making it possible to effectively suppress or prevent an increase in the insertion loss.

In this manner, the first IDT electrode 3A is able to be located close to the first side portion 2a1 without incurring an increase in the insertion loss. It is thus possible to reduce the size of the elastic wave device 1.

The plural second IDT electrodes 3B are located farther apart from the first side portion 2a1 than the first IDT electrode 3A. Because of this configuration, polarization reversal is less likely to occur at the portion where the second IDT electrodes 3B are disposed.

FIG. 5 is a schematic plan view of an elastic wave device 11 according to a second preferred embodiment of the present invention.

The second preferred embodiment is different from the first preferred embodiment in that, in the elastic wave device 11, a connecting line 16A which connects a first bump 15A and the first IDT electrode 3A is located at a position closest to the first side portion 2a1 of the piezoelectric substrate 2. The electrode structure of the elastic wave device 11 other than the above-described points is also different from that of the elastic wave device 1 of the first preferred embodiment.

More specifically, the number and the positional arrangement of second IDT electrodes 13B are different from those of the first preferred embodiment, and the positional arrangement of plural bumps is also different from that of the first preferred embodiment. As in the first preferred embodiment, the first IDT electrode 3A is located closer to the first side portion 2a1 of the piezoelectric substrate 2 than the plural second IDT electrodes 13B in the extending direction of the plural first and second electrode fingers 3Ab1 and 3Ab2 of the first IDT electrode 3A.

Among the plural connecting lines 16A and 6B, the connecting line 16A is located at a position closest to the first side portion 2a1 of the piezoelectric substrate 2. Accordingly, electric charge generated near the first side portion 2A is even less likely to reach the portion where the first and second electrode fingers 3Ab1 and 3Ab2 are disposed. It is thus possible to further suppress or prevent an increase in the insertion loss.

FIG. 6 is a schematic plan view of an elastic wave device 21 according to a third preferred embodiment of the present invention.

The third preferred embodiment is different from the second preferred embodiment in that, in the elastic wave device 21, a second bump 25B is connected to the first busbar 3Aa1 of the first IDT electrode 3A without having the second IDT electrode 13B interposed therebetween. Apart from this point, the configuration of the elastic wave device 21 is similar to that of the elastic wave device 11 of the second preferred embodiment.

The first and second bumps 15A and 25B are connected to the first busbar 3Aa1 of the first IDT electrode 3A via a connecting line 26A. In the third preferred embodiment, electric charge is able to be transferred to the outside via the second bump 25B as well as via the first bump 15A. It is thus possible to more easily transfer electric charge generated near the portion where the first IDT electrode 3A is disposed to the outside. Similarly, it is also possible to more easily transfer electric charge generated near the first side portion 2a1 of the piezoelectric substrate 2 to the outside. Therefore, it is even less likely that polarization reversal will occur in the portion where the first IDT electrode 3A is disposed.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
   a piezoelectric substrate including first and second main surfaces which oppose each other and first and second side portions which oppose each other on the first main surface, a direction of a polarization axis of the piezoelectric substrate being inclined with respect to a direction normal to the first main surface;

first and second interdigital transducer electrodes that are disposed on the first main surface of the piezoelectric substrate and that each include first and second busbars which oppose each other, a plurality of first electrode fingers, and a plurality of second electrode fingers, one end of each of the plurality of first electrode fingers being connected to the first busbar, one end of each of the plurality of second electrode fingers being connected to the second busbar; and a plurality of bumps that are disposed on the first main surface of the piezoelectric substrate and that are each electrically connected to a corresponding one of the first and second interdigital transducer electrodes; wherein the first and second side portions of the piezoelectric substrate extend in a direction perpendicular or substantially perpendicular to the direction of the polarization axis and to the direction normal to the first main surface, and a length of the piezoelectric substrate along the direction of the polarization axis at the first side portion is shorter than a length of the piezoelectric substrate along the direction of the polarization axis at the second side portion;

the first interdigital transducer electrode is located at a position closer to the first side portion than the second interdigital transducer electrode in an extending direction of the plurality of first and second electrode fingers of the first interdigital transducer electrode; and the plurality of bumps include three or more first side bumps disposed along the first side portion, the three or more first side bumps including first, second, and third bumps, the first and second bumps sandwich the first interdigital transducer electrode therebetween in a direction parallel or substantially parallel with the first side portion, and a distance between the first and second bumps is the smallest distance among distances between adjacent bumps of the first side bumps.

2. The elastic wave device according to claim 1, wherein the plurality of bumps include a plurality of second side bumps disposed along the second side portion of the piezoelectric substrate, the plurality of second side bumps including a plurality of fourth bumps, and the distance between the first and second bumps is smaller than distances between adjacent bumps of the plurality of second side bumps.

3. The elastic wave device according to claim 1, wherein the distance between the first and second bumps is a smallest distance among distances between adjacent bumps of all the plurality of bumps.

4. The elastic wave device according to claim 1, wherein at least one of the first and second bumps is electrically connected to the first interdigital transducer electrode.

5. The elastic wave device according to claim 4, wherein the first and second bumps are electrically connected to the first interdigital transducer electrode.

6. The elastic wave device according to claim 4, further comprising:

a connecting line that connects the first interdigital transducer electrode and at least one of the plurality of bumps with each other; wherein the connecting line is located at a position closer to the first side portion of the piezoelectric substrate than the first interdigital transducer electrode.

7. The elastic wave device according to claim 1, further comprising a plurality of lands on which the plurality of bumps are located.

8. The elastic wave device according to claim 1, wherein the first interdigital transducer electrode overlaps the first and second bumps.

9. The elastic wave device according to claim 1, wherein the first bump is connected to the first interdigital transducer electrode.

10. The elastic wave device according to claim 1, wherein the second bump is connected to the first busbar of the first IDT electrode without the second IDT electrode being interposed therebetween.

11. An elastic wave device comprising:

a piezoelectric substrate including first and second main surfaces which oppose each other and are rectangular or substantially rectangular, first and second side portions which oppose each other on the first main surface, and third and fourth side portions which connect the first and second side portions with each other, a direction of a polarization axis of the piezoelectric substrate being inclined with respect to a direction normal to the first main surface;

first and second interdigital transducer electrodes that are disposed on the first main surface of the piezoelectric substrate and that each include first and second busbars which oppose each other, a plurality of first electrode fingers, and a plurality of second electrode fingers, one end of each of the plurality of first electrode fingers being connected to the first busbar, one end of each of the plurality of second electrode fingers being connected to the second busbar; and a plurality of bumps that are disposed on the first main surface of the piezoelectric substrate and that are each electrically connected to a corresponding one of the first and second interdigital transducer electrodes; wherein the first and second side portions of the piezoelectric substrate extend along the first main surface of the piezoelectric substrate and in a direction perpendicular or substantially perpendicular to the direction of the polarization axis, and a length of the piezoelectric substrate along the direction of the polarization axis at the first side portion is shorter than a length of the piezoelectric substrate along the direction of the polarization axis at the second side portion;

the first interdigital transducer electrode is located at a position closer to the first side portion than the second interdigital transducer electrode in an extending direction of the plurality of first and second electrode fingers of the first interdigital transducer electrode;

the plurality of bumps include three or more first side bumps disposed along the first side portion, the three or more first side bumps including first, second, and third bumps;

the first and second bumps sandwich the first interdigital transducer electrode therebetween in a direction parallel or substantially parallel with the first side portion; and a distance between the first and second bumps is smaller than distances between adjacent bumps of the other first side bumps.

12. The elastic wave device according to claim 11, wherein the plurality of bumps include a plurality of second side bumps disposed along the second side portion of the piezoelectric substrate, the plurality of second side bumps including a plurality of fourth bumps, and the distance between the first and second bumps is smaller than distances between adjacent bumps of the plurality of second side bumps.

13. The elastic wave device according to claim 11, wherein the distance between the first and second bumps is a smallest distance among distances between adjacent bumps of all the plurality of bumps.

14. The elastic wave device according to claim 11, wherein at least one of the first and second bumps is electrically connected to the first interdigital transducer electrode.

15. The elastic wave device according to claim 14, wherein the first and second bumps are electrically connected to the first interdigital transducer electrode.

16. The elastic wave device according to claim 14, further comprising:
   a connecting line that connects the first interdigital transducer electrode and at least one of the plurality of bumps with each other; wherein
   the connecting line is located at a position closer to the first side portion of the piezoelectric substrate than the first interdigital transducer electrode.

17. The elastic wave device according to claim 11, further comprising a plurality of lands on which the plurality of bumps are located.

18. The elastic wave device according to claim 11, wherein the first interdigital transducer electrode overlaps the first and second bumps.

19. The elastic wave device according to claim 11, wherein the first bump is connected to the first interdigital transducer electrode.

20. The elastic wave device according to claim 11, wherein the second bump is connected to the first busbar of the first IDT electrode without the second IDT electrode being interposed therebetween.

* * * * *